United States Patent [19]

Muroi et al.

[11] Patent Number: 5,480,957
[45] Date of Patent: Jan. 2, 1996

[54] SPHERICAL CURING AGENT FOR EPOXY RESIN, CURING AGENT MASTERBATCH FOR EPOXY RESIN AND THEIR PREPARATION

[75] Inventors: Souichi Muroi, Shizuoka; Hsi-Chuan Tsai, Kanagawa, both of Japan

[73] Assignee: W. R. Grace & Co.-Conn., New York, N.Y.

[21] Appl. No.: 22,607

[22] Filed: Feb. 18, 1993

Related U.S. Application Data

[63] Continuation of Ser. No. 706,131, May 28, 1991, abandoned.

[51] Int. Cl.$^6$ .................................................... C08G 59/00
[52] U.S. Cl. .................. 528/87; 528/93; 528/94; 528/103; 528/117; 528/118; 525/65; 525/523; 525/524; 525/540; 523/400; 523/407; 523/429
[58] Field of Search .............................. 528/87, 93, 94, 528/103, 117, 118; 525/523, 524, 540, 65; 523/400, 407, 429

[56] References Cited

U.S. PATENT DOCUMENTS

| | | | |
|---|---|---|---|
| 4,588,617 | 5/1986 | Oka | 528/93 |
| 4,732,961 | 3/1988 | Oka | 528/87 |
| 4,844,959 | 7/1989 | Read et al. | 525/524 |
| 4,959,398 | 9/1990 | Oka et al. | 528/93 |

FOREIGN PATENT DOCUMENTS

| | | |
|---|---|---|
| 58-13623 | 1/1983 | Japan. |
| 61-268721 | 11/1986 | Japan. |
| 64-70523 | 3/1989 | Japan. |
| 1-113480 | 5/1989 | Japan. |

OTHER PUBLICATIONS

Lee et al. "Handbook of Epoxy Resins" 1982 Reissue pp. 9–10 and 10–17.
Journal of Applied Polymer Science, vol. 32, 5095–5104 (1986)—"Reactivity of Epoxy Resin in Dispersed Dicyandiamide System and Dynamic Viscoelasticity of the Resulting Product"—Souichi Muroi et al.

*Primary Examiner*—Robert E. Sellers
*Assistant Examiner*—Randy Gulakowski
*Attorney, Agent, or Firm*—Valerie E. Looper

[57] ABSTRACT

A curing agent for epoxy resins is prepared from an amine and an epoxy, as well as subsequent modification by a polyisocyanate compound, in such a manner that the curing agent is in the form of small spherical particles. The particles can be as small as 0.1 microns. This curing agent can be easily dispersed in curing agent masterbatches and curable compositions with minimal effect on their storage stability. The resulting curable compositions have a wide range of applications, including automobile and electronic adhesives.

12 Claims, 3 Drawing Sheets

SPHERICAL CURING AGENT FOR EPOXY RESIN, CURING AGENT MASTERBATCH FOR EPOXY RESIN AND THEIR PREPARATION

This is a continuation of application Ser. No. 706,131, filed May 28, 1991, now abandoned.

TECHNICAL FIELD

The present invention relates to a curing agent for epoxy resin and a method for the preparation of the same.

The present invention also relates to heat curable compositions which comprise such curing agents.

The present invention also relates to a curing agent masterbatch for epoxy resin and a method for the preparation of the same. More specifically, it relates to a curing agent masterbatch for epoxy resin which not only has excellent storage stability and excellent compatibility with an epoxy resin but also can give a one-component curing composition having a low viscosity, a fast curing rate and excellent storage stability when added to an epoxy resin.

BACKGROUND

Because cured articles prepared from an epoxy resin have excellent adhesion, mechanical properties, thermal properties, chemical resistance and excellent electrical properties, they are utilized widely and commercially as paints, adhesives, and electrical and electronic insulation materials. Epoxy resin formulations used for such applications can be either a one-component system or a two-component system.

The two-component system is made of an epoxy resin composition and a curing agent which are separately stored. When needed, they are weighed and mixed just prior to use. In so doing, it is often difficult to avoid mistakes in weighing the correct amount of epoxy and curing agent, as well as difficult to form a homogeneous curing composition. These mistakes are further compounded by the fact the reaction of the epoxy resin and the curing agent starts as they are mixed.

The epoxy resin/curing agent composition is typically in liquid form. The viscosity of the system increases gradually, goes through gelation, and finally the system cures. The time from formulation until it can no longer be used is called "pot life".

The pot life is decided by the chemical structures and the ratio of the epoxy resin and the curing agent employed. Generally, the system with a faster curing rate has a shorter pot life. If a curing agent which is designed with an emphasis on the curing rate is used, a formula can usually be cured at room temperature or lower. However, it will naturally shorten the pot life and it creates a need to frequently formulate a small amount of the composition. Thus, such room temperature curing compositions cause a reduction in working efficiency.

In contrast, because a curing agent is added ahead of time in the epoxy resin of the one-component system, the above-mentioned problems associated with the two-component system can be eliminated. The curing agent used in such systems is typically called a "latent curing agent". The simplest one-component system is based on the curing agent which can cure epoxy resin at high temperatures. Such agents include, but are not limited to, dicyandiamide, phenol novolak, adipic dihydrazide, diallyl melamine, diamino maleonitrile, $BF_3$-amine complexes, amine salts, and modified imidazole compounds and the like. Because these curing agents require a high temperature a slow curing rate is inherent. Thus, the reaction proceeds slowly at room temperature and the epoxy resin compound formulated with curing agents can be stably stored at room temperature or lower temperatures for a certain period. Thus, these systems are especially suitable for one-component systems which are cured at high temperatures.

Such high temperature curing agents do not dissolve in an epoxy resin at room temperature. If such a curing agent is dispersed as particles, the storage stability can be improved drastically. This is due to the small contact area with the epoxy resin. In this case, a small particle size for the curing agent is important because smaller particle sizes increase the curing rate and also make the structure of the cured article very uniform. See J. Appl. Polymer Sci, 32, 5095(1986) Such a dispersion type curing agent can also be called a latent curing agent.

Generally, the epoxy resin curing composition of a one-component system, in its normal state, requires a latent curing agent which can be activated by some form of stimulation. Examples of such latent curing agents include amineimide compounds which are activated by thermal decomposition; ketimine compounds which are activated by contact with moisture; aromatic diazonium salt compound, diallyliodonium salt compounds which are activated by exposure to light; and curing agents which are microencapsulated in material which can be destroyed by mechanical pressure or by heat. However, due to problems such as performance and cost, they are not widely used. As a link before they become truly useful, currently the above-described latent curing agent of the dispersion type is important because the preparation method involved is simpler and less expensive.

However, a particularly promising latent curing agent is the modified amine curing agent adduct obtained by reaction with an epoxy compound. Due to the modification by the epoxy compound, the flaws of amine curing, such as volatility which causes problems in handling, hygroscopicity which significantly affects curability, and compatibility with the epoxy resin, can be improved. Even further, control of the melting point is also possible. Epoxy resin is cured by polyaddition reaction with a curing agent or by ionic polymerization.

However, because curing agents which require secondary processing tend to be expensive, a curing agent of a catalytic polymerization type which does not depend on the addition of equivalent amounts and can be cured with the addition of a small amount, will be an advantage. From the aspect of performance, the curing agent of the anionic polymerization type which does not risk corrosion of metal (tertiary amine adduct) is preferred. A suitable catalyst for this purpose is an imidazole/epoxy resin adduct, and its technology is disclosed in detail in Japanese Patent Publication (Kokai) No. SHO 58-13623 (1983) and SHO 61-268721 (1986). This solid adduct which is synthesized from amine compounds and epoxy resins can be obtained by reacting an amine compound and an epoxy resin in a solvent and then removing the solvent from the system as a whole. Then, it is crushed and pulverized and then sieved to obtain particles of the curing agent of a desired size. There is a limitation to the degree of crushing and pulverization, and it is extremely difficult to commercially prepare fine particles having a Stokes diameter of smaller than about 4 μm.

Because the above-described preparation method is a long and laborious process, it incurs a very high production cost. In addition, due to the limitation of the particle size of the curing agent formed by crushing and pulverization and also to the pulverized state, there are the following disadvantages:

a. bulky and inconvenient for packaging and shipment, b. aggregation of the particles require enormous work to disperse the particles in an epoxy resin when used, c. increase in viscosity takes place when added to an epoxy resin, d. a limit ion the degree of improvement on the curing rate by reduction in particle size, and e. relatively short stable storage period of the formulated curing composition.

Although the particles of the amine compound/epoxy compound adduct has a variety of advantageous features as a curing agent, such advantages have not been used to the full extent with the one component curing composition due to the reasons mentioned above.

On the other hand, the curing agents which are more widely used are ones obtained by treating solid particles of an amine compound/epoxy compound adduct with a polyfunctional isocyanate to improve its latent curability. See Japanese Patent Publication SHO 64- 70523 (1989) and HEI 1-113480 (1989). In this case it is presumed that the polyfunctional isocyanate has been reacted with the particles of the adduct to form an encapsulated film on their surfaces. With this type of latent curing agent which tends to be expensive, it will be advantageous to use an ionic polymerization type curing agent which can be cured with a small amount of addition without regard to the addition of equivalent amounts. From the performance viewpoint, anionic polymerization type curing agents (tertiary amine adducts) which have no risk of corrosion of metal are preferred. The amine compound/epoxy compound adduct can be obtained firstly as a lump by removing the solvent from the reaction system after reacting the amine compound and the epoxy resin in a solvent. Subsequently, it is crushed and pulverized, and then classified and a curing agent of a desired size is removed. Subsequently, the particles of the amine compound/epoxy compound adduct are dispersed in a liquid epoxy resin, and a polyfunctional isocyanate compound is added and reacted in a heated state to prepare a desired latent curing agent as a masterbatch. In Japanese Patent Publication (Kokai) No. HEI 1-113480 (1989), it is assumed that the polyfunctional isocyanate compound added has been adsorbed on the particles of the amine compound/epoxy compound adduct dispersed in an epoxy resin, and that the hydroxyl group therein and the moisture therein are reacted to form a polyurethane polymer and a polyurea polymer to form an encapsulating film. The latency of the agent is imparted by this thermal fusible film which prevents direct contact of the particles of the adduct with the epoxy resin. Further, the polymer composition of the encapsulating film is controlled by the amount of the moisture contained in the particles of the adduct to allow the production of the particles of an encapsulated adduct which has enough solvent resistance against an organic solvent added only in the presence of a suitable amount of water and can withstand the mechanical mixing treatment in the compounding step.

The particles of the amine compound/epoxy compound adduct used for the production of the above described prior art curing agent masterbatch are in the form of relatively large pulverized particles having an average Stokes diameter of about 3 μm or more. Due to the shape of these particles, there are created various following adverse problems when used as the curing agent masterbatch.

The increase in viscosity is greater when using pulverized particles than when using spherical particles. Accordingly, in regards to a curing agent masterbatch, since there is a limit as to the viscosity which can be handled, the concentration of the curing agent has to be lowered in a relative manner.

Therefore, when this curing agent masterbatch is added to prepare an epoxy resin curing composition, no problem emerges if the epoxy resin to be cured is the same epoxy resin as the dispersing medium of the curing agent masterbatch. However, if they are different, the desired properties of epoxy resin to be cured will be diluted by the epoxy used as the dispersing medium. Further, it is not desirable for the viscosity to increase during formulation since it will lower the degree of freedom of formulations design. For example, in order to lower the thermal expansion coefficient of the epoxy resin, a filler is usually added to the epoxy resin curing composition. However, the addition of the filler also increases the viscosity of the composition and accordingly, it is preferred to use a composition having a low as possible viscosity in order to increase the amount of the filler which can be added. For this reason, even if the curing agent of an amine compound/epoxy compound adduct treated with a polyfunctional isocyanate compound has various advantages, such advantages are not fully used in the one-component curing composition.

OBJECTS

It is an object of the invention to provide fine spherical particles of a curing agent for epoxy resin which avoids the above-described problems.

It is another object of the invention to provide a direct and simpler method for the preparation of the fine spherical particles of the curing agent for epoxy resin, wherein the method omits the step of pulverization and sieving and gives a controlled particle size of the fine spherical particles of the curing agent ranging from 0.1 μm to 30 μm.

Still another object of the present invention is to provide a curing agent masterbatch for epoxy resin, wherein the masterbatch has a low viscosity, excellent storage stability and compatibility with an epoxy resin such that it gives a one-component curing composition having a fast curing rate and excellent compatibility when added to the epoxy resin.

SUMMARY OF THE INVENTION

Fine spherical particles of curing agent for epoxy resin in accordance with the invention comprise an amine compound/epoxy compound adduct. More specifically, they relate to curing agents for epoxy resin of a type curable by anionic polymerization. The particles are powdery and not bulky and can be easily dispersed in an epoxy resin with only a small increase in viscosity. The curable compositions prepared therefrom have excellent storage stability.

In another aspect of the invention a direct method for the preparation of fine spherical particles of a curing agent for epoxy resin comprises reacting an amine compound with an epoxy compound in the presence of a dispersion stabilizer in an organic solvent capable of dissolving both said amine compound and said epoxy compound but incapable of dissolving the adduct formed therefrom at elevated temperatures with agitation, and recovering fine spherical particles formed from the reaction mixture solution.

In yet another aspect of the invention a heat curable composition comprises, as its major components, an epoxy compound and spherical particles of a curing agent for the epoxy compound which are an amine compound/epoxy compound adduct, said particles having a melting point of at least 50° C. and a particle diameter of 0.1 μm to 30 μm.

As yet another aspect of the invention a heat curable composition comprises, as its major components, an epoxy compound and a high temperature curable curing agent and, an accelerator comprising spherical particles of an epoxy curing agent which is an amine compound/epoxy compound adduct, said particles having a melting point of at least 50°

C. and a particle diameter of 0.1 μm to 30 μm.

The present invention also includes a curing agent masterbatch for epoxy resin wherein the masterbatch comprises a liquid epoxy resin in which are uniformly dispersed fine spherical particles of an amine compound/epoxy compound adduct having a melting point of at least 50° C. and a particle diameter of 0.1 μm to 30 μm, wherein said spherical particles have been reacted with 1 to 100 parts by weight of a polyfunctional isocyanate compound based on 100 parts by weight of said particles.

The present invention further includes a method for preparing of a curing agent masterbatch for epoxy resin with comprises the steps of:

(a) dispersing spherical particles of an amine compound/ epoxy compound adduct having a melting point of at least 50° C. and a diameter of 0.1 μm to 30 μm in a liquid epoxy resin;

(b) adding 1 to 100 parts by weight of a polyfunctional isocyanate compound based on 100 parts by weight of a polyfunctional isocyanate compound based on 100 parts by weight of said spherical particles at a temperature below the melting point of said spherical particles with agitation; and (c) heating and agitating the resulting mixture at said temperature until the isocyanate groups in said polyfunctional isocyanate compound have been completely reacted.

BRIEF EXPLANATION OF DRAWINGS

In FIGS. 3 and 4, the particles may appear oval, as opposed to spherical. This deformation was caused by cutting the samples with a microtome.

DETAILED DESCRIPTION OF THE INVENTION

Figure 1:
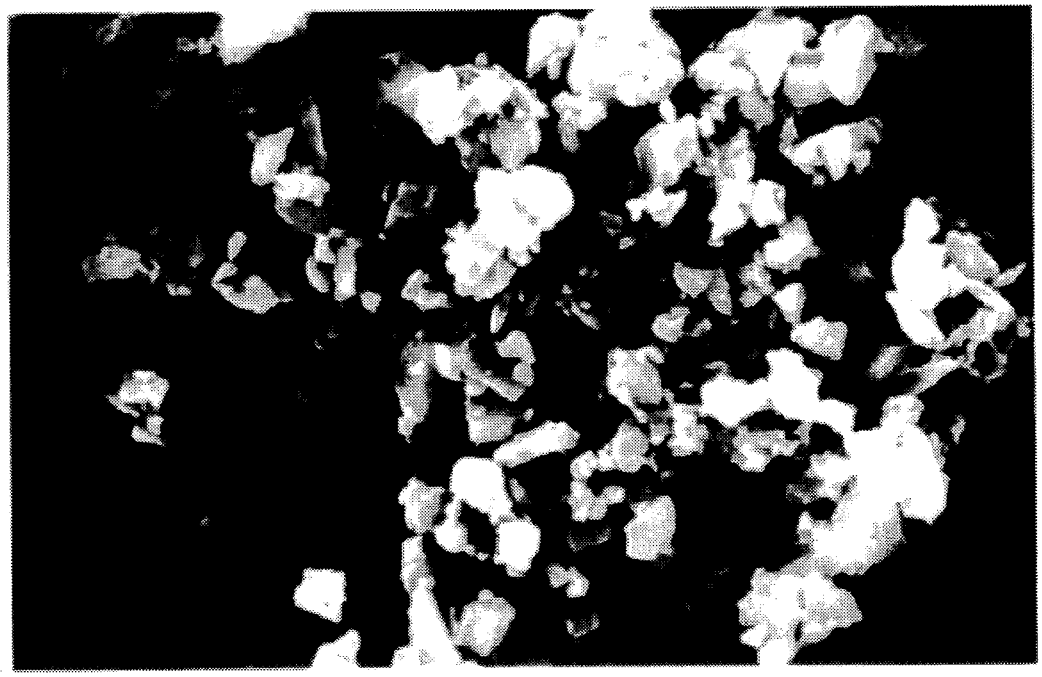
FIG. 1 is an electron micrograph showing the structure of the particles comprising a 2-methylimidazole/bisphenol A diglycidyl ether adduct prepared by the pulverization method of the prior art.

In the present invention the amine compounds and the epoxy compounds which can be employed as the starting materials for the preparation of the spherical curing agent are selected based on the consideration of the properties of the adduct as the curing agent. Important aspects are its chemical structure which promotes the curing reaction by anionic polymerization, its melting point, and its compatibility with the epoxy resin which will be cured in a molten state, its quick curability and its effect of addition (high curing reactivity with a smallest possible amount of addition). The melting point is defined herein as the temperature at which the substance starts to melt, as determined by the conventional methods.

While any kind of amine compounds can be used for this invention, the selection thereof will be determined by the kind of epoxy compound to be combined since in this invention the reaction has to be stopped at the state of addition reaction and polymerization has to be avoided. While it is possible to use any kind of amine compounds with monofunctional epoxy compounds, the amine which can be combined with polyfunctional epoxy compounds is an amine compound which has only one active hydrogen, i.e., a secondary amino group that contributes to the reaction of the epoxy group. In both cases, it is preferred that the amine, in addition, has at least one tertiary amino group having no active hydrogen since the presence of the tertiary amino group is desirable for increasing the concentration of amino groups which contribute to the curing reaction of the adduct, or in other words, to increase the effect of the curing agent.

As will be described below, bifunctional bisphenol A diglycidyl ether is a most commonly employed epoxy compound. The following compounds are suitable examples of amine compounds which can be combined with bifunctional bisphenol A diglycidyl ether: imidazoles represented by 2-methylimidazole and 2,4-dimethylimidazole, peperazines represented by N-methyl piperazine and N-hydroxyethyl-piperazine, anabasines represented by anabasine, pyrazoles represented by 3,5-dimethyl-pyrazole, purines represented by tetra-methyl-quanidine or purine, pyrazoles represented by pyrazole, and triazoles represented by 1,2,3-triazole, and the like.

Any kind of epoxy compound can be employed as the other starting material for the adduct. Examples of such epoxy compounds are monofunctional epoxy compounds such as n-butyl glycidyl ether, styrene oxide and phenylglycidyl ether, bifunctional epoxy compounds such as bisphenol A diglycidyl ether, bisphenol F diglycidyl ether, bisphenol S diglycidyl ether and diglycidyl phthalate; trifunctional compounds such as triglycidyl isocyanurate, triglycidyl p-aminophenol; tetrafunctional compounds such as tetraglycidyl m-xylene diamine and tetraglycidyldiaminodiphenylmethane; and compounds having more functional groups such as cresol novolac polyglycidyl ether, phenol novolac polyglycidyl ether and so on. The selection of epoxy is also determined by the type of the amine compound to be combined. Thus, while the amine compounds having only one active hydrogen can be combined with any kind of epoxy compounds, monofunctional epoxy compounds alone can be combined with the amine compounds having two or more active hydrogens.

The epoxy compounds are also selected by considering the melting point of the adduct formed and the compatibility in a molten state with respect to the epoxy resin which is to be cured. Since the majority of the epoxy resins to be cured comprise bisphenol A diglycidyl ether, this compound is most typically used as the starting material for the preparation of an adduct. These bisphenols possess advantageous compatibility and cost savings.

With an epoxy compound, the concentration of epoxy groups is expressed by "epoxy equivalent weight (EEW)". Lower epoxy equivalent weights give higher concentration of epoxy groups. However, higher concentrations of epoxy groups are desirable for the prevention of the decrease of concentration of tertiary nitrogen atoms in the adduct. Thus a lowest possible epoxy equivalent weight is desirable for the epoxy compound. Epoxy compounds having an epoxy equivalent weight of, at most, 1,000, and preferably at most 500 are typically employed.

The melting point of the amine compound/epoxy compound adduct is influenced by the chemical structures of the amine compound and the epoxy resin employed, the method of addition, the structure of the adducts formed, and the ratio of the addition of the epoxy resin to the amine compound. With a proper selection of theses factors, the synthesis of desired adducts having a low melting point to a high melting point is possible. While higher melting points will make the reaction system easier to handle, they will also raise the curing reaction-onset temperature of the reaction mixture. Therefore, from the viewpoint of curability, lower melting points are preferred. However, if workability, particularly the workability during summer season, is taken into consideration, the melting point has to be at least 50° C.

It is also important to select a solvent which can dissolve the amine compounds and the epoxy compound as the starting materials but can precipitate the adduct in the form of particles without dissolution. Generally, a substance can dissolve in a solvent having a similar polarity. The level of the polarity of a solvent or a substance is often expressed by a solubility parameter having units $(cal/cm^3)^{1/2}$. A typical range of solubility parameters of epoxy compounds will be 8 to 11 $(cal/cm^3)^{1/2}$, and that of amine compounds will be 8 or greater, and that of the amine compound/epoxy compound adduct will be 11 to 16. Thus, in order to achieve the desired precipitation reaction of the present invention, it is suitable to use a solvent having a solubility parameter of 8 to 11.

Examples of such solvents that can be used in the present invention are methyl isobutyl ketone, methyl isopropyl ketone, methyl ethyl ketone, acetone, acetic acid, n-butylacetate, isobutyl acetate, ethyl acetate, methyl acetate, tetrahydrofuran, 1,4-dioxane, cellosolve, ethyleneglycol monoethyl ether, diethyleneglycol dimethyl ether, anisole, toluene, p-xylene, benzene, methylene chloride, chloroform, trichloroethylene, chlorobenzene and pyridine. These solvents can be used alone, or two or more solvents can be used together. It is possible to use the solvents having a solubility parameter outside the range of 8 to 11 if two or more solvents are combined to bring the solubility parameter within the above-described specified range. However, since the precise solubility parameter of the solvents to be used may differ naturally depending on the chemical structures of the amine compound and the epoxy compound, it is essential to make a precise selection for each individual situation. If selection is not precise, even when the precipitation reaction may smoothly proceed, it may also increase the solubility of the adduct formed in the solvent and thus may lower the yield.

The dispersion stabilizer creates a stable dispersion of the adduct particles which precipitate in the solvent during the precipitation reaction. Without such a dispersion stabilizer, the particles of the adduct formed may aggregate and precipitate out as a viscous mass during the reaction, and thus the desired fine spherical particles cannot be obtained. Polymeric compounds having affinity to both the organic solvent and the adduct formed are suitable as the dispersion stabilizer for this invention. Any graft copolymers, block copolymers, random copolymers, and other polymers are suitable. Specific examples of suitable graft copolymers are methyl methacrylate/methacrylic acid copolymers, methyl methacrylate/2-hydroxyethyl methacrylate copolymers, poly(2-hydroxy methacrylate), poly(2,3-dihydroxypropyl methacrylate), poly(acrylamide-2-methylpropanesulfonic acid), poly(vinyl alcohol), poly(vinyl acetate), poly(methacrylic acid), and polyacrylamide, poly(ethylene oxide) and poly(4-vinylethyl pyridium bromide) graft copolymerized with styrene; methyl methacrylate/methacrylic acid copolymers, glycidyl methacrylate/styrene copolymers and methyl methacrylate/fluoroaklyl acrylate copolymers graft-copolymerized with methyl methacrylate; polybutadiene and methyl methacrylate/glycidyl methacrylate copolymers graft-copolymerized with methacrylic acids; polymethyl methacrylate and 2-hydroxyethyl methacrylate copolymers, graft-copolymerized with N-methylol acrylamide; poly(methyl methacrylate), ethyl acrylate/methacrylic acid copolymers methyl acrylate/methacrylic acid copolymers, and styrene/methacrylic acid copolymers graft-copolymerized with 12-hydroxy stearic acid; poly(methyl methacrylate) which is graft-copolymerized with 2-hydroxyethyl methacrylate, and poly(vinyl chloride) graft-copolymerized with ethyleneoxide and the like.

Examples of suitable block copolymers are poly(lauryl methacrylate)/poly(methacrylic acid) block copolymers, poly(styrene)/poly(methacrylic acid) block copolymers, poly(ethylene oxide)/polystyrene/poly(ethylene oxide) block copolymers, and poly(12-hydroxystearic acid)/poly(ethylene glycol)/poly(12-hydroxystearic acid).

Examples of suitable random copolymers are vinyl acetate/vinyl alcohol copolymers, vinyl acetate/N-vinyl pyrrolidone copolymers and N-vinylpyrrolidone/methyl methacrylate copolymers. Examples of other polymers are cationized amine-modified polyesters. Dispersion stabilizers having higher molecular weight will increase the stabilization effect. However, if the molecular weight exceeds a certain limit, it will enhance aggregation of the particles. Thus a suitable molecular weight range of the dispersion stabilizer in the present invention is from 1,000 to 300,000, preferably from 2,000 to 100,000. A variety of the compounds as described above can be employed as the dispersion stabilizer. However, their effect will differ with the chemical structures of the amine compounds and the epoxy compounds selected, Thus, their selection will depend on the effects desired and to a large extent involves selection by conventional trial and error techniques.

The selected amine compound and epoxy compound are dissolved in the selected solvent. After the selected dispersion stabilizer is dissolved into this solution, the solution is then heat agitated. The originally clear solution will become opaque when the adduct is formed. As the reaction progresses, the opaqueness of the reaction system gradually increases, with a characteristic milky white turbid dispersion eventually occurring. Then, the following two procedures may be performed to obtain the desired spherical particles.

According to the first procedure, the reaction is stopped at an appropriate point, i.e., the optimal reaction time for obtaining the highest yield and avoiding the occurrence of flocculation, by cooling the reaction system to room temperature. In certain instances a 100% yield will not be possible because flocculation of the particles occurs before 100% conversion is obtained. In those instances, the appropriate point for stopping the reaction is before flocculation occurs. Particles are separated by filtering the dispersion of the particles of the amine compound/epoxy compound adduct. After fresh solvent is used to wash off unreacted starting material adhered to the particles, the particles are then dried to give the desired fine spherical particles of the curing agent.

According to the second procedure, the reaction is continued to a conversion of 100% and then, the reaction system is cooled to room temperature and spray-dried to give fine substantially spherical particles of a curing agent.

The particle size of the adduct is determined by the types of the starting materials employed, the reaction conditions selected and the type and amount of the dispersion stabilizer employed. Of these factors, the type of the dispersion stabilizer selected is an important factor. For example, in the precipitation reaction of 2-methylimidazole and bisphenol A diglycidyl ether in methyl isobutyl ketone, dispersion stabilizer comprising a methyl methacrylate/methacrylic acid copolymer graft-copolymerized with styrene or methyl methacrylate will give a particle having a particle size of about one micron. On the other hand, a cationized amine-modified polyester will give fine spherical particles having a particle diameter of less than one micron, i.e. sub-micron.

Another factor which can have a significant effect is the reaction conditions employed. Generally, the particle size of the adduct increases with increased concentrations of the starting materials and conversions but decreases with increased concentrations of the dispersion stabilizer and reaction temperatures. These tendencies are also affected by the chemical structure of the specific dispersion stabilizer employed.

In order to obtain a stable dispersion the amount of the dispersion stabilizer employed is typically 5 to 40% by weight, based on the total weight of the amine compound and the epoxy compound. When the reaction temperature and the concentration of the starting materials are too high, aggregates may easily form even in the presence of a suitable amount of the dispersion stabilizer. Thus, the reaction temperature which can be employed in the present invention is typically 40° C. to 90° C., preferably 50° C. to 70° C., and the concentration of the starting materials, i.e. the amine compound and the epoxy compound, is typically 2 to 40% by weight, preferably 5 to 30% by weight.

Further, the formation of aggregates relates to the agitation conduction and whether the amine/epoxy react completely, i.e. 100% conversion. An optimal agitation rate will vary depending on the composition of the starting materials, the reaction conditions and the configuration of an agitation wing. However, an excessively fast agitation will enhance the formation of aggregates, while excessively slow agitation is not suitable for the production of fine spherical particles. Thus, the agitation rate will vary for each individual reaction system and thus will largely be determined by conventional trial and error techniques. Although it may depend also on the reaction conditions, aggregates are usually more easily formed at higher conversions.

Basically, the ratio of the amine compound to the epoxy compound is set in such a way that the concentration of active hydrogens in the amine compound and the concentration of epoxy groups in the epoxy compound are at an equivalent ratio. However if the system is such that conversion does not reach 100%, it is not necessary to use an equivalent ratio, and the starting materials recovered from the reaction system can be reused. When the filtrate and the washing solution are combined and the concentrations of the amine compound, the epoxy compounds and the dispersion stabilizer are accurately measured and then extra solvent is removed and deficient starting materials are supplemented, the result of the reaction will be nearly the same as the starting reaction system. Thus, when the starting materials are recovered and recycled, it is also possible to use excessive amount of one of the starting materials due to the relation to the structure of the adduct.

In the present invention it is possible to prepare spherical particles of the curing agent having a diameter of 0.1 μm to 30 μm. Such particles are capable of producing a curing agent masterbatch having a low viscosity and a high concentration of the curing agent particles.

Viscosity and hydroxyl amount are important aspects to consider in selecting a liquid epoxy resin as the dispersion medium for the particles of the amine compound/epoxy compound adduct in preparation of a curing agent masterbatch. The hydroxy groups react with a polyfunctional isocyanate compound to increase the viscosity of the reaction system, and may lead to gelation. Therefore, the liquid epoxy resin to serve this purpose should at least contain a very low level of such hydroxy groups.

A low viscosity of the dispersion medium allows the particles of the adduct to disperse at higher concentrations. In addition, use of the masterbatch and the curing composition into which the masterbatch is used should be taken into consideration. Because the epoxy resin as the dispersion medium is incorporated into the chemical structure of the cured article, this consideration is self-evident. In case of a highly heat-resistant composition, the epoxy resin dispersion medium should be selected accordingly. In case of a low metal corrosive composition, the epoxy resin dispersion medium with a low degradable chlorine content should be selected.

The curing agent masterbatch can be prepared by treating the adduct particles with a polyfunctional isocyanate compound. Suitable polyfunctional isocyanate compounds include the mononuclear and polynuclear species of toluene diisocyanate and methylene diphenyl diisocyanate, hydrogenated methylene diphenyl diisocyanate, 1,5-naphthalene diisocyanate, isophorone diisocyanate, hexamethylene diisocyanate, xylylene diisocyanate, hydrogenated xylylene diisocyanate, tetramethylxylene diisocyanate, 1,3,6-hexamethylene triisocyanate, lysine diisocyanate, triphenylethane triisocyanate, TRIS(isocyanateophenyl) thiophosphate, polyfunctional isocyanate compounds formed by addition of such compounds and other active hydrogen-containing compound, and any mixtures thereof.

The amount of the polyfunctional isocyanate compound employed for the particles of the adduct affects the storage stability and the curability of a curing agent masterbatch. With the same particles of the addition product, increased amounts of the polyfunctional isocyanate compound improve the storage stability but lower the curability. Thus, for adduct particles having a diameter of 0.1 μm to 30 μm, the polyfunctional isocyanate compound is employed in an amount of 1 to 100 parts by weight, preferably 10 to 50 parts by weight for sub-micron-size particles and preferably 2 to 10 parts by weight for micron size particles based on 100 parts by weight of the adduct particles. Thus, the compromise between storage stability and curability varies depending on the size of the adduct particle, with smaller particle sizes requiring increased amounts of polyfunctional isocyanate compound.

Depending on the application of the adduct particles, it is often preferred to adjust the moisture content of the particles before their use. Moisture in the particles can easily be increased by exposure to a high humidity.

Figure 3:
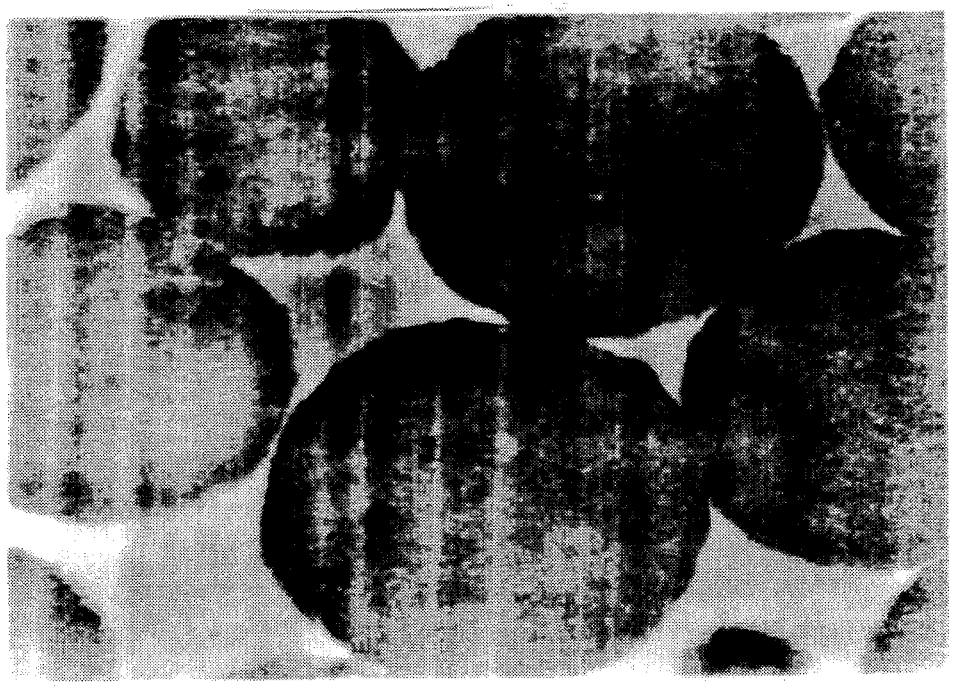
FIG. 3 is another electron micrograph showing a cross sectional view of particles comprising a 2-methylimidazole/ bisphenol A diglycidyl ether adduct prepared by the method of the present invention.
Figure 4:
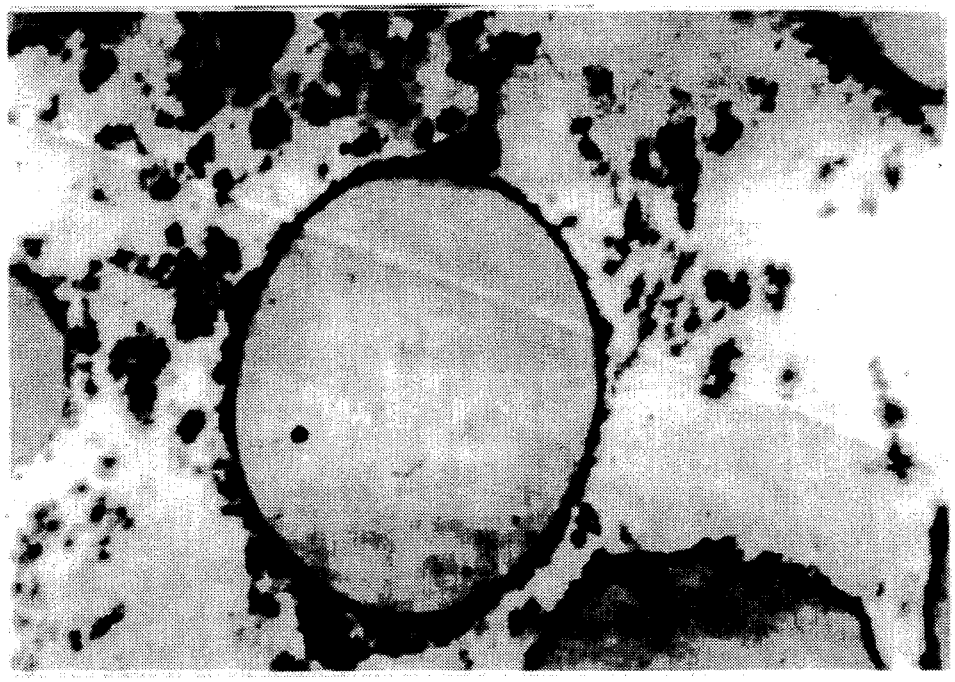
FIG. 4 is an electron micrograph of a cross sectional view of the particles comprising encapsulated 2-methylimidazole/ bisphenol A diglycidyl ether adduct prepared by the method of the present invention.

The particles of the adduct are uniformly dispersed in a liquid epoxy resin. Because fine particles often form secondary particles, it is required to mechanically disperse them in the epoxy resin as primary particles. For example, by blending with a three roll mill and heating at a temperature lower than the melting point of the particles with constant agitation, the adduct particles can be dispersed in the epoxy resin. When the temperature has reached a predetermined temperature, a polyfunctional isocyanate compound is then added at a rate that does not cause excessive increase in temperature to react with the adduct particles. The heating and agitation are continued to reduce the concentration of the polyfunctional isocyanate compound as much as possible. The reaction is completed when no free isocyanate groups remain. However, complete reaction of the isocyanate groups is not always necessary. By the treatment with this polyfunctional isocyanate compound, as clearly demonstrated by comparison of the transmission electron micrographs as shown in FIGS. 3 and 4, an encapsulating layer as described in Japanese Patent Publication (Kokai) No. HEI 1-113480 is formed on the surface of the particles of the adduct. The encapsulated particles as shown in these photographs were those obtained by treating particles of a 2-methylimidazole/bisphenol A diglycidyl ether adduct with 20% by weight of poly-MDI (MILLIONATE® MR-300 polyisocyanate from Nippon Polyurethane Kogyo K.K.), based on the weight of the adduct and the curing agent masterbatch of the encapsulated particles of the adduct were added to a bisphenol A diglycidyl ether/polyamide polyamine curing composition, and the mixture was heated to cure at 50° C. for 48 hours. The sample thus prepared was sliced to a thin film by means of a microtome and then stained with osmic acid.

According to the method of the present invention, the particles of an amine compound/epoxy compound adduct as the curing agent for epoxy resin can be prepared without pulverization and sieving as done in conventional methods. In addition, the formed particles are spherical and their size can be at the sub-micron level, i.e. 0.1 μm, up to micron levels of 30 μm. Even further, the latent curability of the resulting particles is far superior to that of the prior art, because of the polymeric dispersion stabilizer compound which has high affinity to both the organic solvent and the adduct.

The spherical form of the particles provides a variety of advantages to the curing agent itself or the curing composition which is blended with the curing agent. The advantages are indicated below.

a. Due to high bulk density, the packaging volume can be reduced, thus reducing packaging and shipping costs.
   b. Dispersion into an epoxy resin is relatively simple, thus simplifying the preparation method of a curing composition.
   c. Increase in viscosity after addition to epoxy resin is minimal. This is a very desirable feature when the epoxy resin has a relatively high viscosity. This advantage provides a higher degree of freedom for formula design.
   d. The improved latent curability provides a curing composition having a longer storage stability.

As evident from the description herein, the present invention can extend the storage period of time of a one-component curing composition without causing any damage to the curability.

The spherical particles of the curing agent of the present invention, by itself, can function as a latent anionic polymerization type curing agent. When used together with other polyaddition type curing agents which are curable at high temperatures, such as dicyandiamide and acid anhydrides, they can work effectively as a latent accelerator to efficiently lower their curing temperature.

As stated above, according to the present invention, a low viscosity curing agent masterbatch can be prepared much more simply than by the conventional methods. Thus, when the viscosity is kept the same, it is possible to prepare a highly concentrated curing agent masterbatch. The masterbatch thus prepared, when added to an epoxy resin, can give a curing composition having a remarkably lower viscosity than the one prepared from pulverized adduct particles. This means that more filler can be added at the same level of viscosity. The addition of higher amounts of filler not only reduces the cost but also reduces the shrinkage that can occur during curing of the composition. The electrical conductivity of the composition can be improved when using an electrically conductive filler.

The above-mentioned features allow the spherical particles of the present invention to be used as a one-component curing composition for epoxy resin for a broad range of applications. Examples are structural adhesives, such as adhesives for assembly of automobiles, adhesives for assembly of optical equipment; and adhesives for assembly of electronic and electrical equipment; powder paint in the paint field, baking paint, and the like; impregnation of glass cloth for printed circuit board, IC chip sealing material, electrically conductive paint, solder resist, adhesive for die bonding, adhesive for printing board, and electrically conductive adhesive and the like in the electronic field; impregnating electrically insulating material coil, adhesive for battery casing, and adhesive for tape head, and the like in the electrical field.

In order to further illustrate the practice of the present invention and the advantages thereof, the following examples are provided. However, these examples are in no way meant to be limitative, but merely illustrative.

COMPARATIVE EXAMPLE 1

Xylene (600 g) and 2-methylimidazole (hereinafter "2 Mz") (300 g) were charged in a 3,000 ml three-necked round bottom flask equipped with a thermometer, a reflux condenser and stainless steel propeller type agitating device. With constant agitation, the flask was heated at 120° C. to completely dissolve the 2 Mz. Subsequently, while agitation was continued, a solution prepared by dissolving 680 g of EPIKOTE® 828 bisphenol A diglycidyl ether, (epoxy equivalent weight: 186) a product of Yuka-Shell K.K., in 300 g of xylene was added over a period of 90 minutes while the temperature was kept at 120° C. Because the adduct formed was insoluble in xylene, it precipitated as a viscous mass as the reaction proceeded. Reaction was continued for additional 2 hours. After confirming that the conversion had exceeded 98% by the analysis of epoxyl groups by the method to be described in Example 4, the temperature was lowered to room temperature.

Agitation was stopped, and the xylene in the upper layer was removed by decantation, and the remaining contents of the flask were heated to 140° C. to remove the remaining xylene by distillation under reduced pressure of 10 mm Hg. Subsequently, the molten adduct was poured in a shallow dish and cooled to obtain a novolak-like reddish brown adduct. This product was crushed and pulverized repeatedly by a jet mill and finally fractioned to obtain particles having a Stokes diameter of 2.9 μm. To determine Stokes diameter, crushed and pulverized particles were dispersed in cyclohexane by using a table top type SINPAR® VS-10111 ultrasonic cleaner, a product of Iuchi Seieido K.K., and measurement was taken in an automatic particle size distribution CAPA-700 analyzer of ultracentrifuge type, a product of Horiba Seisakusho K.K. The electron micrograph of the particle's shape is illustrated in FIG. 1.

Curing agent particles made from 2 Mz/epoxy resin adduct prepared by, this prior art method (pulverization method) was added to EPIKOTE® 828 epoxy, and the property of the curing composition was determined. The curing composition was prepared by the following procedure.

Particles of the 2 Mz/EPIKOTE 828 epoxy adduct 10 parts by weight (10 parts per hundred parts resin) were added to 100 parts by weight of EPIKOTE 828 epoxy, and then blended briefly. The particles of the curing agent were then completely dispersed by a three-roll mill. As is known, the fine particles which are primary particles in a dry state form secondary particles by aggregation, and enormous mechanical abrasion and crushing are required for obtaining perfect dispersion. The dispersion was checked with a grain gauge for each passage through the three-roll mill. When they were passed through the roll mill at a rate of 120 g/minute, three passages were required for obtaining a perfect dispersion of the particles of the curing agent.

Viscosity and gel times (measured by the stroke cure method), were used to measure the curing rate of the curing composition. A cured material was prepared separately by curing at 120° C. for 30 minutes, and tensile properties and water resistance (water absorption when soaked in boiling water for 6 hours), and Tg were measured as the measure of heat resistance. The results are shown in Table 1.

EXAMPLE 1

Methyl iso-butyl ketone ("MIBK") (2,750 g) was charged in a 5,000 ml three-necked round-bottom flask equipped with a thermometer, a reflux condenser and a glass half moon-shaped agitating device, 2 Mz (160 g) was then added to the flask and temperature was raised to 60° C. to dissolve the 2 Mz completely. Subsequently, 425 g of a 30 weight % MIBK solution of a methyl methacrylate/methacrylic acid copolymer graft-copolymerized with GC-10 methyl methacrylate, a product of Toagosei Chemical Ind. Co., Ltd. was added as a dispersion stabilizer. Then 700 g (1.88 equivalent weight) of a 50 weight % MIBK solution of EPIKOTE® 828 epoxy was added. The concentration of the starting materials for the adduct was 12.6% by weight, the total concentration of all starting materials was 15.8% by weight and the amount of the dispersion stabilizer based on the weight of the starting materials for adduct was 25% by weight. In this Example and those that follow, these phrases have the following definitions:

"the concentration of the starting materials for the adduct" means the total weight of the amine compound and the epoxy compound based on the total weight of the amine, the epoxy, the dispersion stabilizer and the solvent; and "the total concentration of the starting materials" means the total weight of the amine, the epoxy and the dispersion stabilizer based on the total weight of the amine, the epoxy, the dispersion stabilizer and the solvent.

While the contents were agitated at a rate of 400 r.p.m., the reaction was carried out at 60° C. for 8 hours. The reaction mixture which was initially transparent gradually turned to bluish translucent complexion, and then changed to a milky opaqueness at the end of the reaction. The reaction mixture was cooled down to room temperature after the reaction was completed, and left to stand overnight to precipitate the formed particles. After removing the supernatant by decantation, particles were separated by filtration, and then washed thoroughly with MIBK and dried in vacuum at 40° C. for 24 hours to obtain 268 g of white particles of a curing agent. The particle size in the MIBK dispersion immediately after completion of the reaction was measured by a Laser particle analyzer (manufactured by Ohtsuka Denshi K.K., LPA 3000/3100). The average particle size was 2.5 μm.

As clearly shown by the example of recovery and reutilization of unreacted starting materials which will be explained in Example 4, a part of the dispersion stabilizer being used for the formation of particles was immobilized on the particles, and thus could not be recovered. Perhaps a portion of the stabilizer had reacted with the epoxy groups and were fixed chemically into the particles, with the remaining portion perhaps immobilized by adsorption. However, if such an amount was determined for the fourth particle growth experiment in Example 4, it was on average 40% of the consumed starting materials for the adduct. Thus, if 268 g is used as the weight for the particles of curing agent obtained in this example, the formed adduct comprises 190 g thereof and the immobilized dispersion stabilizer comprises 78 g. Therefore, the conversion was 37%. If the dispersion stabilizer was regarded as a starting material for the formed particles, the yield of particles will be 42%.

Although the reaction was stopped at a conversion of 37% in this example, it was confirmed by a preliminary experiment that further progress of the reaction will cause micro- and then macro-flocculation. The agitation rate, i.e., 400 r.p.m., used in this experiment was determined by the preliminary experiment. With faster agitation rates, e.g. greater than 600 r.p.m., aggregates were formed before the conversion reached 37%, and with slower agitation rates, e.g. less than 100 r.p.m., perfectly spherical particles of the adduct will not be formed.

Figure 2:
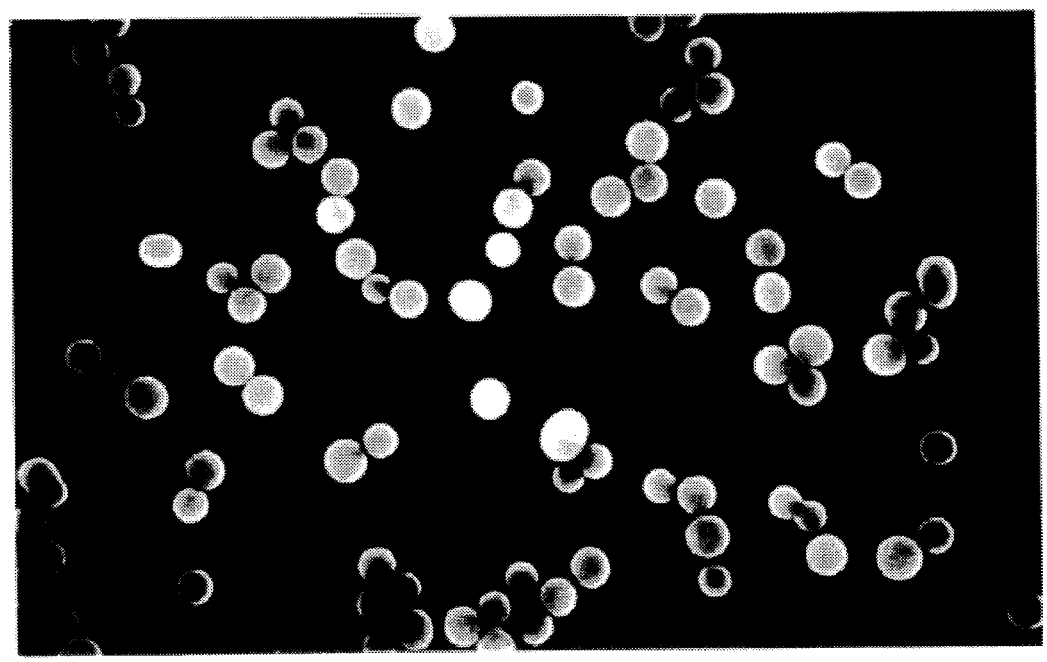
FIG. 2 is an electron micrograph showing the structure of particles comprising a 2-methylimidazole/bisphenol A diglycidyl ether addition product prepared by the method of the present invention.

The shape of the particles by electron micrography is shown in FIG. 2, and they are nearly perfect spheres. The bulk density of these particles is compared with that of the pulverized particles prepared by the method of the prior art, at the same size, in Table 1. Because spherical particles can be packed more compactly, the bulk density was nearly double that of the pulverized particles, thus offering a compact package for convenient shipment.

The spherical particles of the curing agent thus prepared were added to EPIKOTE® 828 epoxy in the same manner as described in Comparative Example 1 to prepare a curing composition. But, dispersion of the particles of the curing agent by a three roll mill is far easier than observed in Comparative Example 1. While three passages were required in the Comparative Example 1, only one passage was required to create a perfectly dispersed state. The properties of the curing composition are shown in Table 1.

Compared to the curing composition containing pulverized curing agent particles, the characteristic difference is viscosity. While adding even such a small amount, such as 10 phr. of pulverized curing agent particles could raise the viscosity of the EPIKOTE 828 epoxy from 13,800 cps to 42,000 cps at 20° C., the viscosity of the spherical curing agent particles of this Example 1 was increased only to 27,000 cps. A difference was also seen in gelation rate and storage stability. Although the curing rate of the particles of the curing agent prepared by the method of the prior art is slightly slower than the curing agent of this invention, the pot life of the Comparative Example 1 was only 1 week whereas that of the present invention was 8 weeks. Without being held to any particular theory, it is believed that the presence of the dispersion stabilizer immobilized on the particles' surface as compared to the curing agent particles prepared by the method of the prior art, which typically have no dispersion stabilizer immobilized therein, resulted in the difference as described above. There were no particular differences in the color, physical properties and water resistance (water absorption) of the cured material.

EXAMPLE 2

MIBK (3,400 g) was charged in the same reactor as in Example 1, and then 2 Mz (1.39 epoxy equivalent weight) (115 g) was added, and the temperature was raised to 50° C. to dissolve the content completely. Subsequently, 146 g of GC-10 dispersion stabilizer (25 weight % methyl ethyl ketone/butyl acetate solution) was added. Then 500 g of a 50 weight % MIBK solution of EPIKOTE® 828 (1.34 epoxy equivalent weight) was added. The concentration of the starting materials for the adduct was 8.8%, the total concentration of the starting materials was 9.7% by weight, the amount of the dispersion stabilizer based on the weight of the starting materials of the adduct was 10.0% by weight. They were reacted at 50% for 24 hours with constant agitation. After completion of the reaction, the reaction mixture was treated in the same manner as Example 1 to obtain 81 g of white particles of a dried curing agent. The particles thus obtained were perfect spheres, and the diameter was 0.21 μm. Calculation on the same basis as in Example 1 gave a conversion of 16% and a particle yield of 20%.

The bulk density of the particles of the curing agent was drastically decreased as shown in Table 1, by as much as the decreased proportion of size. However, in the preparation of the curing composition by addition of 10 phr. to EPIKOTE® 828 epoxy, there was no tendency for the dispersed state to decline. Thus a perfectly dispersed state was created by only one passage through the three-roll mill.

The properties exhibited by the curing compositions of Example 2 are in Table 1, together with those of Example 1 and Comparative Example 1. Compared to Example 1, decrease in particle size has resulted in the increase in viscosity of the curing composition, and the curing rate has been increased substantially. On the contrary, the storage stability has declined by as much proportion as the increased portion of the curing rate, but the level is still fairly high compared to that of the Comparative Example 1. The effect of the decrease in the size of the particles of the curing agent can be seen in the property of the cured product. Although the color of the cured material, like Example 1, was reddish brown and translucent, improvements, however small, were seen on heat resistance, tensile strength, elongation and water resistance.

EXAMPLE 3

MIBK (2,750 g) was charged in the reactor of the Example 1, and then 195 g (1.94 epoxy equivalent weight) of N-methylpiperazine (herein "N-MP") was added and the temperature was raised to 60° C. to dissolve the contents completely. Subsequently, after adding 425 g of GC-10 as the dispersion stabilizer, 700 g (1.88 epoxy equivalent weight) of a 50% MIBK solution of EPIKOTE® 828 epoxy was added. The concentration of the starting materials for the adduct was 13.4%, the total concentration of the starting materials was 16.5% by weight, the amount of the dispersion stabilizer was 23.4% by weight, based on the weight of the starting materials for the adduct. They were reacted at 60° C. for 14 hours with constant agitation at a rate of 400 r.p.m. After completion of the reaction, the spherical particles of a curing agent formed by the procedure of Example 1 were recovered as dried white particles. The amount of the particles was 174 g, the particle size was 0.55 μm and the bulk density was 0.26. The calculation on the same basis as in Example 1 gave a conversion of 23% and a particle yield of 26%.

The particles of the curing agent thus obtained was added in 10 phr. dosage to EPIKOTE 828 epoxy in the same manner as in Comparative Example 1 to prepare a curing composition. The dispersed state was no more different from Example 1 and Example 2. Thus a perfectly dispersed state was created by only one passage through a three roll mill. The properties of the curing composition are shown in Table 1. Compared to the curing agent made of the 2 Mz/EPIKOTE 828 epoxy adduct, the curing rate at 120° C. was faster and the curing rate at 140° C. was slower. On the other hand, the storage stability was substantially better than that of the curing agent made of the 2 Mz/EPIKOTE® 828 epoxy.

The properties of the cured material were compared with those of the curing agent made of the 2 Mz/EPIKOTE 828 epoxy adduct. A major difference was its external appearance. Unlike the reddish brown semi-clear material of the latter, the cured material made of N-MP/EPIKOTE 828 epoxy adduct was a slight yellowish, transparent material and showed slightly inferior tensile strength, but greater elongation. The heat resistance and water resistance of this cured material were also slightly inferior.

EXAMPLE 4

In Examples 1 to 3, the reaction was stopped at a conversion of less than 50%. From a commercial viewpoint, it is preferred to recover and reuse unreacted starting materials. For this matter, it is desirable to quantitatively and accurately determine the concentrations of the starting materials in the recovered filtrate and washing liquid, remove unnecessary solvent, readjust it to the original reaction composition, and to obtain the particles of the adduct identical to the first run of the reaction. If it is possible, it should be possible to convert the starting materials into the particles of the adduct without any waste by repeating the process. Such an example is illustrated below.

MIBK (2,750 g) was charged in the reactor of Example 1, and then 2 Mz (160 g) was added to the reactor, and the temperature was raised to 60° C. to dissolve the contents completely. Then, 425 g of GC-10 (30 weight % MIBK solution) was added as the dispersion stabilizer, and then 700 g of a 50 weight % MIBK solution of EPIKOTE® 828 epoxy was added. The concentration of all starting materials for the adduct was 12.6% by weight, the total concentration of the starting materials was 15.8% by weight and the amount of the dispersion stabilizer was 25% by weight, based on the weight of the starting materials for the adduct. They were reacted at 60° C. for 8 hours with agitation at a rate of 400 r.p.m. After completion of the reaction the particles formed were recovered by the procedure of Example 1 to obtain white dried particles.

The filtrate after removal of the particles and the washing liquid:were combined, and the concentrations of 2 Mz, EPIKOTE 828 epoxy, and the dispersion stabilizer in this combined liquid were measured. The following methods of measurement were used:

Concentration of 2 Mz in the presence of an epoxy resin: After adding glacial acetic acid and crystal violet to the sample solution, it was titrated with 0.1 N perchloric acid/acetic acid solution.

Concentration of the epoxy resin in the presence of 2 Mz: the epoxy ring was cleaved by hydrochloric acid, and excess hydrochloric acid was titrated potentiometrically with a silver nitrate solution.

Concentration of the dispersion stabilizer: Determined by GPC, from the peak area ratio, using standard polystyrene as the internal standard and also 3.32 as the proportionality constant. The relationship between the weight ratio of a dispersion stabilizer (GC-10) to standard polystyrene and the peak area ratio of the dispersion stabilizer is represented by the following equation:

$(W_{GC-10}/W_{pst}) = 3.32 \ (A_{GC-10}/A_{pst})$ wherein W=weight, A=peak area, and pst=standard polystyrene.

The results of the measurements are shown in Table 2, as the % recovery, relative to the amounts of the starting materials. Since the precision of the measurement was not high, the actual recovery percentage was not close to theoretical percentages. However, as will be described below, even this level of accuracy can be used for most practical purposes.

The combined filtrate and washing liquid were concentrated to 2,500 g in vacuum, and was used for the second run of the reaction. Additional EPIKOTE epoxy and GC-10 stabilizer were added to readjust the reaction composition to match the one in the first run, and it was reacted for 6 hours under the same conditions. Difference of the reaction time from the first run was caused by slight difference of the course of the reaction, since there was a tendency to form aggregates in this reaction time. Third and fourth reaction runs were carried out by the same procedure. The results are summarized in Table 2. As the reaction progresses by repetition, it creates some difference in the course of the reaction, but particles of the adduct of the same size are obtained without any problem.

In Table 2, the percent recovery of EPIKOTE® 828 epoxy was only about 80% of 2 Mz. The amount of charge of 2 Mz was 97%, but this relative percent recovery was substantially lower. On the other hand, the percent recovery of the dispersion stabilizer should reach about 100%, if there was no immobilization on the particles. This evidence clearly suggests consumption of a part of the epoxy groups by the dispersion stabilizer, thus causing chemical immobilization of the dispersion stabilizer on the particles. Other portions of stabilizer were immobilized by adsorption. Attempt was made to calculate the amount of the dispersion stabilizer immobilized on the particles. Although the data is varied, it reached on average about 40% of the formed adduct.

The particles of the adduct obtained by the procedure of Example 1 were added in 10 phr. dosage to EPIKOTE 828 epoxy to prepare a curing composition. Properties are shown in Table 2, but there are no significant differences in curability and storage stability. The above results indicate that there is no problem in recovery of unreacted starting materials and the recovered materials can be recycled for use.

TABLE 1

| Properties | Comparative Example 1 | Example 1 | Example 2 | Example 3 |
| --- | --- | --- | --- | --- |
| Particles of curing agent | | | | |
| Shape | Pulverized | Spherical | Spherical | Spherical |
| Particle size (μm) | 2.9 | 2.5 | 0.21 | 0.55 |
| Bulk density (g/ml) | 0.30 | 0.62 | 0.18 | 0.26 |
| Number of passage through a three-roll mill required for dispersion | 3 | 1 | 1 | 1 |
| Curing composition | | | | |
| Viscosity (cps, 20° C.) | 42,000 | 27,300 | 40,500 | 38,000 |
| Gel time (seconds: 120° C. | 90 | 129 | 93 | 81 |
| 140° C. | 62 | 66 | 56 | 78 |
| Pot life (days, 20° C.) | 7 | 56 | 47 | 72 |
| Cured product | | | | |
| External appearance | Reddish brown translucent | Reddish brown translucent | Reddish brown translucent | Pale yellow clear |
| Tg (°C.) | 156 | 157 | 158 | 146 |
| Tensile property: Strength (kg/cm$^2$) | 532 | 571 | 622 | 515 |
| % Elongation | 2.4 | 3.2 | 6.1 | 8.8 |
| Water absorption in boiling water (%, soaked for 6 hours) | 0.9 | 0.9 | 0.7 | 0.8 |

TABLE 2

| Results | First Run | Second Run | Third Run | Fourth Run |
| --- | --- | --- | --- | --- |
| Particles of adduct | | | | |
| Reaction temperature (°C.) | 60 | 60 | 60 | 60 |
| Reaction temperature (hr) | 8 | 6 | 7 | 5.5 |
| Amount of particles formed (g) | 277 | 260 | 290 | 224 |
| Conversion (%) | 39 | 36 | 40 | 31 |
| Yield of particles (%) | 43 | 41 | 45 | 35 |
| Particle size (μm) | 2.5 | 3.3 | 3.3 | 3.5 |
| Unreacted starting materials recovered | | | | |
| 2Mz (%) | 61.9 | 72.5 | 55.8 | 71.6 |
| Epikote 828 (%) | 50.9 | 57.6 | 43.2 | 60.3 |
| GC-10 (%) | 23.6 | 30.3 | 37.9 | 39.2 |
| Curability and storage stability | | | | |
| Gel time (sec., 120° C.) | 126 | 137 | 124 | 133 |
| Pot life (days, 20° C.) | 47 | 52 | 45 | 48 |

COMPARATIVE EXAMPLE 2

MIBK (3,400 g) was charged in a 5,000 ml three-necked, round bottom flask equipped with a thermometer, reflux condenser and a half moon-shaped glass agitator, and then 2 Mz (115 g) (1.39 epoxy equivalent weight) was added, and the temperature was raised to 50° C. to completely dissolve the contents. Then, 146 g of GC-10 (25 weight %) in a methyl ethyl ketone/butyl acetate solution was added as the dispersion stabilizer, and then 500 g (1.34 epoxy equivalent weight) of 50 weight % "BADGE" EPIKOTE® 828 bisphenol A diglycidyl ether, a product of Yuka-Shell K.K., (epoxy equivalent weight: 186) in MIBK solution was added. The concentration of the starting materials for the adduct was 8.8% by weight, the total concentration of the starting material was 9.7% by weight, and the amount of the dispersion stabilizer added, based on the weight of the starting materials for the adduct was 10.0% by weight. While the contents were agitated at a rate of 400 r.p.m., the reaction was carried out at 50° C. for 24 hours. The reaction system, which was transparent initially gradually changed to bluish translucent, and it finally changed to a milky white opaqueness at the end of the reaction.

After the reaction, the reaction mixture was cooled down to room temperature, and left to stand overnight to precipitate the particles formed. After removing the clear supernatant by decantation, particles were isolated by filtration and washed thoroughly with MIBK. Then, the particles were dried under vacuum at 40° C. for 24 hours to obtain 81 g of white particles of the adduct. The average particle size, analyzed by a Model LPA 3000/3100 laser particle size analyzer, manufactured by Ohtsuka Denshi K.K. was 0.21 µm. According to the observation with an electron microscope, the particles of the 2 Mz/EPIKOTE 828 epoxy adduct prepared by this precipitation reaction method were spherical. The analysis by infrared absorption spectroscopy shows that part of the dispersion stabilizer used has been immobilized on the particles of the adduct.

Forty parts by weight of the spherical particles of the adduct thus prepared were added to 100 parts by weight of BADGE epoxy which hardly contained hydroxy groups (DER® 332 epoxy, a product of Dow Chemical Co., (epoxy equivalent weight: 173). The particles were then dispersed completely by passing the mixture through a three-roll mill to form a curing agent masterbatch. Then, this curing agent masterbatch was added to BADGE epoxy having an epoxy equivalent weight of 186 to bring the concentration of the particles of the adduct to 15% by weight to prepare a curing composition. This curing composition was heated and cured at 100° C. for one hour and then at 150° C. for 3 hours to prepare a cured product, and its glass transition temperature (Tg), tensile properties and water absorption were measured. The following methods were used for measurements:

Tg: measured by a differential calorimeter

Tensile property: measured according to JIS K7113

Water absorption: weight percent gained of a sample having a diameter of 39 mm and a thickness of 4 mm after soaking it in water at 100° C. for 6 hours.

The properties of the curing agent masterbatch, the curing composition and the cured product are shown in Table 3.

COMPARATIVE EXAMPLE 3

MIBK (3240 g) was charged into the three-necked round bottom glass of the device as described in Comparative Example 2. Then, 2 Mz (115 g) was added, and the temperature was raised to 50° C. to dissolve the content completely. Then, after adding GC-10 (219 g), a 50 weight % EPIKOTE® 828 epoxy solution in MIBK (500 g) was added. The concentration of the starting materials for an adduct was 9.0% by weight, the total concentration of the starting materials was 10.3 by weight and the amount of dispersion stabilizer added, based on the weight of the starting materials for the adduct was 15.0%. While the contents were agitated at 400 r.p.m., the reaction was carried out at 50° C. for 24 hours to obtain spherical particles of an adduct having an average particle diameter of 0.52 µm (107 g) by the procedure of Comparative Example 2. A curing agent masterbatch, a curing composition and a cured product were prepared by the procedure of Comparative Example 2, and their properties were measured. The results are shown in Table 4.

EXAMPLE 5

One hundred and twenty grams of the particles of the 2 Mz/EPIKOTE 828 epoxy adduct prepared in Comparative Example 1, was kept under saturation humidity for 48 hours to absorb 5.2% by weight moisture, based on the adduct. These moisture-regulated particles of the adduct were added to 300 g of DER®332 epoxy, and they were blended briefly and passed through a three-roll mill for obtaining a complete dispersion. The viscosity of the dispersion at 30° C. was 29,100 cps. Three hundred and fifty grams of the dispersion were transferred to a reactor equipped with a heatable agitation device and the reactor was heated to 60° C. with constant agitation. While maintaining the reactor at 60° C., 10 g of MR-300 poly-MDI, a product of Nippon Polyurethane Kogyo K.K. was added, and the reaction mixture was kept at this temperature for two hours, and then cooled to prepare a curing agent masterbatch. According to the analysis by a Schimadzu FTIR analyzer, 1.8% of poly-MDI remained unreacted. The viscosity of this curing agent masterbatch at 30° C. was 59,500 cps. In the same manner as in Comparative Example 3, this masterbatch was added to EPIKOTE® 828 epoxy so that its concentration, based on the weight of the adduct, would be 15% by weight to prepare a curing composition. A portion was used to prepare the sample for the measurement of the properties of the cured product obtained, as described in Comparative Example 3. The properties of the curing agent masterbatch, the curing composition, and the cured product are shown in Table 3.

EXAMPLE 6

Three hundred and fifty grams of the dispersion of the particles of the 2 Mz/EPIKOTE 828 epoxy adduct prepared in the same manner as Example 5 was transferred to a reactor equipped with a heatable agitation device. With constant agitation, the temperature was raised to 60° C. Subsequently, while maintaining this temperature, 20 g of MR-300 poly-MDI was added over a period of about one hour. This temperature was maintained for 2 hours, and then the reaction mixture was cooled to prepare a curing agent masterbatch. This curing agent masterbatch contained 2.3% of unreacted poly-MDI. The viscosity of this curing agent masterbatch at 30° C. was 112,000 cps. Subsequently, a curing composition was prepared by the procedure of Example 5 and a sample of a cured product was prepared by the procedure of Comparative Example 2. Properties of curing agent masterbatch, curing composition and cured product are shown in Table 3.

EXAMPLE 7

Three hundred and fifty grams of the dispersion of particles of the 2 Mz/EPIKOTE® 828 epoxy adduct prepared in the same manner as Example 5 were transferred to a reactor equipped with a heatable agitation device. With constant agitation, it was heated to 60° C. Then, while maintaining this temperature, 30 g of MR-300 poly-MDI was added over a period of about one hour. The temperature was kept at 60° C. for additional 3 hours, and then the reaction mixture was cooled to form a curing agent masterbatch. This curing agent masterbatch contained 1.7% of unreacted poly-MDI. The viscosity of this curing agent masterbatch at 30° C. was 194,000 cps. Subsequently a curing composition was prepared by the procedure of Example 5 and a sample of a cured product was prepared by the method as described in Comparative Example 2. The properties of the curing agent masterbatch, the curing composition and the cured product are shown in Table 3.

EXAMPLE 8

Three hundred and fifty grams of a dispersion of particles of 2 Mz/EPIKOTE 828 epoxy adduct prepared in the same manner as Example 5 were transferred to a reactor equipped with a heatable agitation device and heated to 60° C. with constant agitation. Then, while maintaining this temperature, 40 g of MR-300 poly-MDI was added over a period for about one hour, and the mixture was heated at the same temperature for additional 3 hours, and then cooled to form a curing agent masterbatch. This curing agent masterbatch contained 2.6% of unreacted poly-MDI. The viscosity of the curing agent masterbatch at 30° C. was 305,000 cps. Subsequently, a curing composition was prepared by the procedure of Example 5 and a sample of a cured product was prepared by the method as described in Comparative Example 2. The properties of the curing agent masterbatch, the curing composition and the cured product are shown in Table 3.

EXAMPLE 9

Three hundred and fifty grams of the dispersion of particles of the 2 Mz/EPIKOTE® 828 epoxy adduct prepared by the same procedure as in Example 5 was transferred to a reactor equipped with a heatable agitation device and heated to 60° C. with constant agitation. Subsequently, while maintaining this temperature, 50 g of MR-300 poly-MDI was added over a period of about 2 hours. Then, the reaction mixture was heated at the same temperature for additional 4 hours, and then cooled to form a curing agent masterbatch. This curing agent masterbatch contained 2.8% of unreacted MR-300 poly-MDI. The viscosity of this curing agent masterbatch at 30° C. was 450,000 cps. Subsequently, a curing composition was prepared by the procedure of Example 5, and a sample of a cured product was prepared by the method according to Comparative Example 2. The properties of the curing agent masterbatch, the curing composition and the cured product are shown in Table 3.

EXAMPLE 10

Three hundred and fifty grams of the dispersion of particles of the 2 Mz/EPIKOTE® 828 epoxy adduct prepared by the same procedure as in Example 5 was transferred to a reactor equipped with a heatable agitation device. With constant agitation, temperature was brought to 60° C. Then, while maintaining this temperature, 100 g of MR-300 poly-MDI was added over a period of about 2 hours, and while the same temperature was maintained, the mixture was heated for additional 4 hours, and then cooled to form a curing agent masterbatch. This curing agent masterbatch contained 2.9% of unreacted poly-MDI.

While the trend was the same with other examples, it was observed in this Example that nearly all the poly-MDI had been consumed in an amount almost equal to that of the particles in the cured product. Normally, poly-MDI can react only with the hydroxy groups of the additional product, and thus it is believed that such a large amount of poly-MDI would not be consumed by the addition product alone. Without being held to a particular theory, it is believed that this level of consumption is possible only by reaction with the carboxyl groups of the dispersion stabilizer which are immobilized on the particles and the water in the particles.

The viscosity of this curing agent masterbatch at 30° C. was 1,400,000 cps. Subsequently, a curing composition was prepared by the procedure of Example 5 and a sample of a cured product was prepared by the method as described in Comparative Example 2. The properties of the curing agent masterbatch, the curing composition and the cured product are shown in Table 3.

As shown in Table 3, the properties of the curing agent masterbatch, the curing composition and the cured product changed with added amounts of poly-MDI. In the instance of the properties of the curing agent masterbatch, as the added amount of poly-MDI increased, the viscosity increased and the storage stability extended quickly. From the aspect of storage stability, larger amounts of poly-MDI are desirable. However, from the aspect of production, the upper limit is 100 phr., beyond which the production will be difficult. Without being held to a particular theory, various reasons for the increase in viscosity caused by increased amounts of poly-MDI, include an increase in the concentration of the dispersed phase. Perhaps, the polymerization of poly-MDI caused by the moisture contained in the dispersion medium, the increase in the molecular weight of the epoxy resin caused by the reaction with a minute amount of hydroxy groups contained in the epoxy resin used as the dispersion medium, and the increase in viscosity due to the polymerization of epoxy resin by the adduct, have all contributed.

Like the storage stability of the curing agent masterbatch, the storage stability of the curing composition is improved rapidly by the increase of the added amount of poly-MDI. Now, the behavior of gel time which serves as the criterion for the curing rate differs drastically with curing temperatures. While increase in gel time is only slight in the curing process at a temperature higher than 120° C. at around 10% of poly-MDI, gel time declines gradually with the increase of the amount of poly-MDI addition if the amount of addition is increased beyond 10%. The trend of this decrease is more significant, the higher the temperature used for heating. In contrast, in the curing reaction at a temperature lower than 110° C., the gel time increases with the improvement of storage stability. In other words, the curing reactivity declines.

The properties of the cured product vary with the increased amounts of poly-MDI added. First, the Tg which is the criterion of heat resistance declines, slightly, as increased amounts of poly-MDI are added. Although the tensile strength declines also with increased amounts of poly-MDI added, the percent elongation increased. Thus the cured product tends to become stronger. There is no significant change in the water absorption (criterion of water resistance) with increased amounts of poly-MDI added.

TABLE 3

| Properties | Comparative Example 2 | Example No. 5 | 6 | 7 | 8 | 9 | 10 |
|---|---|---|---|---|---|---|---|
| Masterbatch | | | | | | | |
| Particle size of adduct (μm) | 0.21 | 0.21 | 0.21 | 0.21 | 0.21 | 0.21 | 0.21 |
| Amount of MR-300 added (%/adduct) | 0 | 10 | 20 | 30 | 40 | 50 | 100 |
| Viscosity (ps. 30° C.) | 291 | 595 | 1120 | 1940 | 3050 | 4500 | 14000 |
| Stable storage period (days) | | | | | | | |
| 50° C. | ≦1 day | 5 | 12 | 14 | 25 | 30 | 54 |
| 30° C. | 5 | 32 | 61 | 78 | 120 | 260 | >360 |
| Curing composition | | | | | | | |
| Concentration of adduct (%) | 15 | 15 | 15 | 15 | 15 | 15 | 15 |
| Viscosity (ps, 30° C.) | 115 | 136 | 167 | 210 | 265 | 351 | 1070 |
| Gel time (seconds) | | | | | | | |
| 100° C. | 186 | 467 | 538 | 656 | 818 | 869 | 9100 |
| 110° C. | 121 | 148 | 160 | 184 | 249 | 398 | 4600 |
| 120° C. | 65 | 67 | 61 | 50 | 45 | 44 | 15 |
| 140° C. | 30 | 33 | 31 | 30 | 24 | 17 | 5 |
| Pot life (days) | | | | | | | |
| 50° C. | ≦1 | 11 | 26 | 29 | 48 | 57 | 105 |
| 30° C. | 10 | 118 | 180 | 230 | 300 | 360 | >360 |
| Cured product | | | | | | | |
| Tg (°C.) | 158 | 159 | 158 | 155 | 153 | 151 | 146 |
| Tensile properties | | | | | | | |
| Strength (kg/cm$^2$) | 622 | 613 | 591 | 593 | 584 | 582 | 523 |
| % Elongation | 6 | 5 | 8 | 7 | 9 | 13 | 16 |
| Water absorption (%, soaked in boiling water for 6 hours) | 0.7 | 0.9 | 0.9 | 0.8 | 1.0 | 1.1 | 1.2 |

EXAMPLE 11

A dispersion of particles of an adduct was prepared by the procedure of Example 5 except that the particles of the 2 Mz/EPIKOTE® 828 epoxy adduct prepared in Comparative Example 3 were used. The viscosity of the dispersion at 30° C. was 17,700 cps. Three hundred and fifty grams of this dispersion were transferred into a reactor equipped with a heatable agitation device, and it was heated to 60° C. with constant agitation. Subsequently, while maintaining this temperature, 10 g of MR-300 poly-MDI was added over a period of about one hour and the reaction mixture was heated at the same temperature for additional two hours, and then cooled to form a curing agent masterbatch. This curing agent masterbatch contained 2.3% of unreacted poly-MDI. The viscosity of this curing agent masterbatch at 30° C. was 37,000 cps. Subsequently, a curing composition was prepared by the procedure of Example 5 and a sample of a cured product was prepared by the method as described in Comparative Example 5, and a sample of a cured product was prepared by the method as described in Comparative Example 2. The properties of the curing agent masterbatch, the curing composition and the cured product are shown in Table 4.

EXAMPLE 12

Three hundred and fifty grams of the dispersion of particles of an adduct prepared by the same procedure as Example 5 was transferred to a reactor equipped with a heatable agitation device, and it has heated to 60° C. with constant agitation. Subsequently, 20 g Of MR-300 poly-MDI was added over a period of about one hour at this temperature, and then the reaction mixture was heated at the same temperature for additional 2 hours, and then cooled to form a curing agent masterbatch. This curing agent masterbatch contained 2.8% of unreacted poly-MDI. The viscosity at 30° C. was 72,000 cps. Then, a curing composition was prepared by the procedure of Example 5, and a sample of a cured product was prepared by the method as described in Comparative Example 2. The properties of the curing agent masterbatch, the curing composition and the cured product are shown in Table 4.

EXAMPLE 13

Three hundred and fifty grams of the dispersion of particles of an adduct prepared by the same procedure as Example 5 were transferred to a reactor equipped with a heatable agitation device, and was heated to 60° C. with constant agitation. While maintaining this temperature, 30 g of MR-300 poly-MDI was added over a period of about one hour. While maintaining the same temperature, it was heated for additional 3 hours, and then cooled to form a curing agent masterbatch. This curing agent masterbatch contained 1.9% of unreacted poly-MDI. The viscosity at 30° C. was 132,000 cps. Subsequently, a curing composition was prepared by the procedure of Example 5, and a sample of a cured product was prepared by the method described in Comparative Example 2. The properties of the curing agent masterbatch, the curing composition and the cured product are shown in Table 4.

Comparison of Table 3 with Table 4 clearly shows the effect of the size of the particles of the adduct. Although larger particle sizes did not show a basic difference in the effect of poly-MDI treatment, the situation is slightly different with smaller particles. With larger particle sizes, the viscosity declines and the latent effect is greater even when they were treated by the same amount of poly-MDI. On the other hand, no significant difference is seen in the properties of the cured products.

TABLE 4

| Properties | Comparative Example 3 | Example No. 11 | 12 | 13 |
|---|---|---|---|---|
| Masterbatch | | | | |
| Particle size of adduct (μm) | 0.52 | 0.52 | 0.52 | 0.52 |
| Amount of MR-300 added (%/addition product) | 0 | 10 | 20 | 30 |
| Viscosity (ps. 30° C.) | 177 | 370 | 720 | 1320 |
| Stable storage period | | | | |
| (days) | | | | |
| 50° C. | ≦1 day | 18 | 35 | 44 |
| 30° C. | 15 | 142 | 161 | 230 |
| Curing composition | | | | |
| Concentration of adduct (%) | 15 | 15 | 15 | 15 |
| Viscosity (ps, 30° C.) | 108 | 113 | 142 | 173 |
| Gel time (seconds) | | | | |
| 100° C. | 192 | 472 | 561 | 726 |
| 110° C. | 132 | 155 | 169 | 225 |
| 120° C. | 68 | 65 | 63 | 51 |
| 140° C. | 30 | 29 | 29 | 28 |
| Pot life (days) | | | | |
| 50° C. | ≦1 | 13 | 31 | 42 |
| 30° C. | 22 | 189 | 232 | 320 |
| Cured product | | | | |
| Tg (°C.) | 157 | 158 | 155 | 153 |
| Tensile properties | | | | |
| Strength (kg/cm$^2$) | 618 | 613 | 590 | 586 |
| % Elongetion | 5 | 4 | 6 | 7 |
| Water absorbtion (%, soaked in boiling water for 6 hours) | 0.8 | 1.0 | 0.1 | 0.9 |

EXAMPLE 14

MIBK (2,750 g) was charged in the same reaction apparatus as described in Comparative Example 3, and then N-methylpiperazine N-MP (195 g) (1.94 epoxy equivalent weight) was added, and the temperature was raised to 60° C. to dissolve the materials. Then, 425 g of a 30 weight % MIBK solution of GC-10 dispersion stabilizer, and finally 700 g (1.88 epoxy equivalent weight) of a 50 weight % MIBK solution of EPIKOTE® 828 epoxy was added. They were reacted at 60° C. for 14 hours with agitation at 400 r.p.m. to give 174 g of spherical particles of an adduct having a particle diameter of 0.55 μm, the procedure as described in Comparative Example 3. The moisture content of the particles of the adduct thus obtained was adjusted to 5.4% by weight, and then the particles were dispersed in DER 332 under the conditions of Example 5 to form a dispersion. The viscosity of the dispersion at 30° C. was 16,800 cps. Three hundred and fifty grams of the dispersion were transferred to a reactor equipped with a heatable agitation device and heated to 60° C. with constant agitation. Subsequently, while maintaining this temperature, 15 g of MR-300 poly-MDI was added over a period of about one hour, and the mixture was heated for additional 2 hours at the same temperature, and then cooled to form a curing agent masterbatch. This curing agent masterbatch contained 2.7% of unreacted poly-MDI. The viscosity of this curing agent masterbatch at 30° C. was 43,000 cps. Then, a curing composition was prepared by the procedure of Example 5, and a sample of a cured product was prepared by the method as described in Comparative Example 2. The properties are given below.

Curing Agent Masterbatch

Viscosity at 30° C.: 43,000 cps

Stable storage period at 50° C.: 22 days

Curing Composition

Viscosity at 30° C.: 12,100 cps

Stable storage period at 50° C.: 35 DAYS

Gel time at 120° C.: 88 seconds

Properties of Cured Product

Tg: 138° C.

Tensile strength: 586 kg/cm$^2$

% Elongation: 10%

Water absorption after soaking in boiling water for 6 hours: 1.1%

COMPARATIVE EXAMPLE 4

The pulverized particles of the adduct (200 g) as prepared in Comparative Example 1 was added to nearly OH-free BADGE (herein "DER 332", a product of Dow Chemical Company, epoxy equivalent weight: 173) (300 g). Then the mixture was briefly blended and was passed through a three-roll mill three times to completely disperse the particles in BADGE epoxy. The dispersion 250 g was transferred into a reactor equipped with a heatable agitation device and heated to 60° C. with constant agitation. While maintaining this temperature, MILLIONATE MR-300 methylene diphenyl diisocyanate/formaldehyde condensate 4 g (herein "poly-MDI"), a product of Nippon Polyurethane Kogyo K.K. was added over a period of about one hour. The mixture was heated for additional 2 hours at the same temperature and then cooled to prepare a curing agent masterbatch. According to the result of analysis by Shimadzu Seisakusho's FTIR analyzer, unreacted poly-MDI was not detected in the reaction mixture. The properties of the curing agent masterbatch thus prepared are shown in Table 5. The initial viscosity was measured by a Brookfield viscosimeter, and the stable storage period is the time until gelation takes place.

In order to measure the properties of the curing agent masterbatch, the curing agent masterbatch was added to EPIKOTE® 828 epoxy to prepare a curing composition. The amount added was sufficient to obtain a curing composition having 10% by weight adduct based on the total weight of the epoxy. The initial viscosity, the gel time (measured by stroke cure technique) as the criterion of curing rate and the stable storage period of this curing composition were measured and the results are shown in Table 5. A portion of the curing composition was heated and cured at 100° C. for one hour and then at 150° C. for 3 hours to form a cured article, and its glass transition temperature (Tg), tensile properties and water absorption were measured. The methods of measurements employed are as follows:

Tg: by a differential thermal analyzer

Tensile properties: procedures specified in JIS K-7113

For water absorption, a sample (39 mm in diameter and 5 mm in thickness) was soaked in water at 100° C. for 6 hours, and the increase in weight was measured. The results are shogun in Table 5.

COMPARATIVE EXAMPLE 5

The 2 Mz/EPIKOTE® 828 epoxy adduct prepared in the same manner as Comparative Example 4 was crushed and pulverized in a jet mill to obtain particles having a Stokes diameter of 9.8 μm. These particles were processed in the same manner as in Comparative Example 4 to form a DER® 332 epoxy masterbatch. Only the amount of the poly-MDI used for treatment was different. It was 2% by weight based on the weight of the particles of the adduct. The properties of this curing agent masterbatch, the curing composition prepared in the same manner as in Comparative Example 4 and the cured article are shown in Table 5.

EXAMPLE 15

MIBK (2,805 g) was charged in a 5,000 ml three-necked round bottom flask equipped with a thermometer, a reflux condenser and a glass half moon-shaped agitation device. 2 Mz (150 g), a RESEDA GP-300 styrene/glycidyl methacrylate copolymer grafted with methyl methacrylate, a product of Toagosei Chemical Ind. Co., Ltd. (24.3) g as a dispersion stabilizer, and 150.5 g of a 32.3% MIBK solution of RESEDA GP-101S methyl methacrylate/methacrylic acid copolymer graft-copolymerized with methyl methacrylate, a product of Toagosei Chemical Ind. Co., Ltd. as a dispersion stabilizer were added, and then the temperature was raised to 70° C. to dissolve these substances completely. Then, 672.9 g of a 50 weight % solution of EPIKOTE® 828 epoxy was added, and the reaction was carried out at 70° C. for 9 hours, while the contents were agitated at the rate of 400 r.p.m. The reaction mixture which was faintly milky at the beginning changed gradually into a milky white, opaque with the progress of reaction, and it became a cream-colored milky white liquid at the end of the reaction.

When the conversion attained 100% by the reaction carried out at 70° C. for 9 hours, the reaction mixture was cooled down to room temperature, and dried by a GS-31 spray dryer for organic solvent system, manufactured by Yamato Kagaku K.K. Dried particles of a curing agent were recovered. The following conditions were employed in spray-drying the particles.

| | |
|---|---|
| Spray nozzle diameter | 0.4 mm |
| Temperature at the entrance of drying chamber | 110° C. |
| Temperature at the exit from drying chamber | 75° C. |
| Flow rate of hot gas | 0.53 m³/min. |
| Spray pressure | 1.0 kg/cm² |
| Fluid transport rate | 7.9 g/min. |
| Temperature at the exit from condenser | 12° C. |

A near theoretical amount of dried particles was recovered by spray drying. The average particle diameter of the particles of the curing agent was measured by the method described in Comparative Example 1. It was 1.1 μm. The ratio of MIBK recovered was 98.8%. When this MIBK was subjected to analysis, none of the starting materials were detected.

Two hundred grams of the particles of the adduct thus prepared were added to 300 g of DER® 332 epoxy, briefly kneaded and completely dispersed by passing through a three-roll mill. In the case of the pulverized particles of the adduct of Comparative Examples 4 and 5, three passages through the roll mill were required for obtaining a perfect dispersion. In contrast, in the case of the spherical particles of the adduct of this Example, a perfect dispersed state was reached by a single passage. Two hundred and fifty grams of the dispersion were transferred to a reactor equipped with a heatable agitation device and heated to 60° C. with constant agitation. While maintaining this temperature, MILLIONATE MR-300 methylene diphenyl diisocyanate (MDI)/formaldehyde condensate 15 g, a product of Nippon Polyurethane K.K. was added over a period of about one hour, and the mixture was heated for 6 hours to completely react the poly-MDI added. The properties of this curing agent masterbatch are shown in Table 5.

The curing agent masterbatch thus prepared was added to EPIKOTE® 828 epoxy so that the amount would be 10 p.h.r., based on the weight of the adduct, to prepare a curing composition. The properties of the curing composition and the cured article were measured in the same manner as Comparative Example 4. The results are shown in Table 5.

EXAMPLE 16

Figure 5:
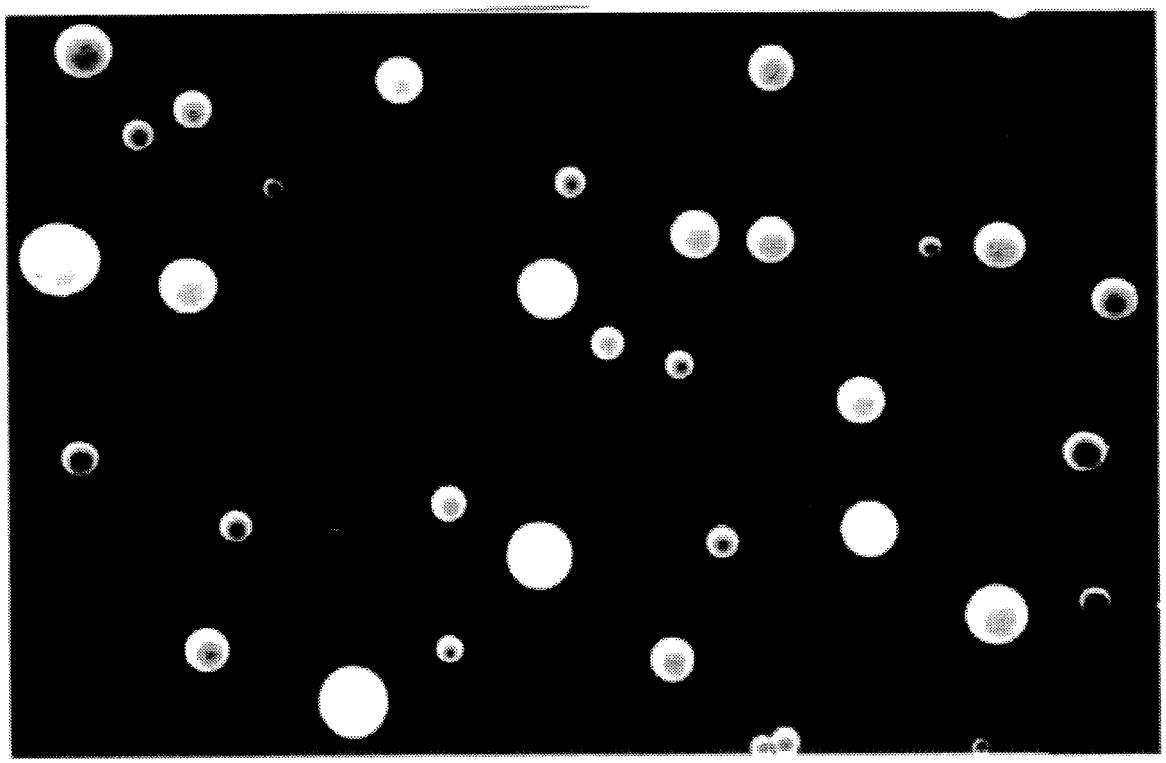
FIG. 5 is another election micrograph showing the structure of the particles comprising a 2-methylimidazole/bisphenol A diglycidyl ether adduct prepared by the method of the present invention.

MIBK (3,390 g) was charged into a 5,000 ml three-necked round bottom flask equipped with a thermometer, a reflux condenser and a glass half moon-shaped agitation device.- After adding 2 Mz (140 g) and RESEDA GP-300 copolymer (22.7 g) as the dispersion stabilizer, the temperature was raised to 70° C. to completely dissolve the mixture. Then, 628 g of a 50 weight % MIBK solution of EPIKOTE® 828 epoxy was added. While the contents were agitated at a rate of 400 r.p.m., the reaction was carried out at 70° C. for 9 hours to bring the conversion to 100%. The dispersion of the adduct thus prepared was spray-dried under the same conditions as in Example 15 to obtain dried particles. The average particle diameter of the spherical particles thus obtained was 2.8 μm. FIG. 5 is an electron micrograph showing the morphology of the particles.

Two hundred grams of the particles of the adduct were dispersed in 300 g of DER 332 epoxy by the procedure of Example 15, and 250 g of the dispersion thus prepared was transferred to the reactor equipped with a heatable agitation device and heated to 60° C. with constant agitation. While maintaining this temperature, 4 g of MILLIONATE MR-300 poly-MDI was added over a period of about one hour and the mixture was agitated and heated for 4 hours while maintaining the same temperature to react all the added poly-MDI. The properties of the curing agent masterbatch thus obtained are shown in Table 5.

By the procedure of Example 15, 10 phr. of the curing agent masterbatch was added to EPIKOTE 828 epoxy to prepare a curing composition, and the properties of the curing composition and the cured article were measured. The results are shown in Table 5.

EXAMPLE 17

MIBK (2,805 g) was charged on a 5,000 ml three-necked round bottom flask equipped with a thermometer, a reflux condenser and a glass half moon-shaped agitation device. 2 Mz (150 g), RESEDA GP-300 copolymer (24,3 g), and RESEDA GP-102S copolymer from Toagosei Chemical Ind. Co., Ltd. (153.8 g) were added to the flask, and the temperature was raised to 70° C. to completely dissolve these substances. Subsequently, 673 g of a 50 weight % solution of EPIKOTE® 828 was added, and while the contents were agitated at a rate of 250 rpm, the reaction was carried out at 70° C. for 9 hours to bring the conversion to 100%. The dispersion of the adduct thus prepared was spray-dried under the same conditions as in Example 15 to obtain dried particles. The average particle diameter was 9.9 μm.

Two hundred grams of the particles of the adduct were dispersed in 300 g of DER® 332 epoxy by the procedure of Example 15 and 250 g of the dispersion thus obtained was transferred to a reactor equipped with a heatable agitation device and heated to 60° C. with constant agitation. While maintaining this temperature, MILLIONATE® MR-300 poly-MDI (2 g) was added over a period of about one hour, and while keeping at the same temperature, the mixture was agitated and heated for 4 hours to react all the added poly-MDI. The properties of the curing agent masterbatch are shown in Table 5.

Ten phr. of the curing agent masterbatch was added to EPIKOTE 828 epoxy by the procedure of Example 15 to prepare a curing composition, and the properties of this curing agent composition and the cured articles were measured and the results are shown in Table 5.

EXAMPLE 18

MIBK (2,352 g) was charged in a 5000 ml three-necked round bottom flask equipped with a thermometer, a reflux condenser and a glass half moon-shaped agitation device. After adding N-MP (190.4 g) and RESEDA GP-300 copolymer (27 g) to the reactor, the temperature was raised to 70° C. to dissolve these substances. Then, 700 g of a 50 weight % MIBK solution of EPIKOTE® 828 epoxy was added. With constant agitation at a rate of 250 rpm, the contents were reacted at 70° C. for 20 hours to bring the conversion to 100° C. The dispersion of the adduct thus prepared was spray-dried under the same conditions as in Example 15 to obtain dried spherical particles. The average particle diameter was 2.7 μm.

Two hundred grams of the particles of the adduct was dispersed in 300 g of DER® 332 epoxy by the procedure of Example 15 and two hundred and fifty grams of the dispersion thus obtained was transferred to a reactor equipped with a heatable agitation device and heated to 60° C. with agitation. While maintaining this temperature, MILLIONATE® MR-300 poly-MDI (4 g) was added over a period of about one hour. While maintaining the same temperature, the mixture was agitated and heated for 4 hours to completely react the added poly-MDI. The properties of the curing agent masterbatch are shown in Table 5.

Ten phr. of the curing agent masterbatch was added to EPIKOTE 828 epoxy by the procedure of Example 15 to prepare a curing composition, and the properties of the curing composition and the cured article were measured and the results are shown in Table 5.

The curing agent masterbatch derived from the fine spherical particle of the adduct prepared by the precipitation method of this invention, those prepared by the pulverizing method of the prior art, the curing composition added with such curing agent masterbatches, and the cured articles are compared in Table 5 for their properties. In this case, the particle size is varied over a wide range, since the particle size can significantly affect the viscosity and the curability. The results shown in Table 5 indicate the following:

(1) The spherical particles of the adduct of this invention and the pulverized particles of the adduct prepared by the method of the prior art have nearly identical curability (based on gel time) and storage stability properties as a result of the treatment with the polyfunctional isocyanate compound under the same conditions, if the particle size of the adduct is kept the same.

(2) If the particle size of the adduct differs, smaller particle sizes will give a better curability, but the viscosity of the curing agent masterbatch and the curing composition will increase.

(3) Smaller sizes of the adduct will give a cured article with slightly better properties. However, there is hardly any difference due to the morphology of the particle of the adduct.

When the particles of the adduct obtained by the method of the prior art are compared with those of the adduct of the present invention, the present invention, as the curing agent masterbatch and the curing composition, is superior to the prior art in the following aspects.

(1) In the preparation of a curing agent masterbatch, the dispersion in the epoxy resin as the dispersion medium is easier to take place. While three passages are required for obtaining a complete dispersion of the particles of the adduct by the method of the prior art, only a single passage can achieve a perfect dispersion for the particles of the adduct of the present invention.

(2) If comparison is made with the approximately same particle size of the particles of the adducts, the particles of the adducts, by the present invention has a far lower viscosity of the curing agent masterbatch.

(3) If a comparison is made between prior art particles of this invention wherein the particles of each have approximately the same particle size, the particles of the invention result in a curing composition having a far lower viscosity.

TABLE 5

| Properties | Comparative Example No. | | Example No. | | | |
|---|---|---|---|---|---|---|
| | 4 | 5 | 15 | 16 | 17 | 18 |
| Masterbatch | | | | | | |
| Composition of adduct | 2Mz/Epikote 828 | " | " | " | " | N-MP/Epikote 828 |
| Shape of particle | Pulverized | Pulverized | Sphere | Sphere | Sphere | Sphere |
| Particle size (μm) | 2.9 | 9.8 | 1.1 | 2.8 | 9.9 | 2.7 |
| No. of passage through the three-roll mill required for dispersion | 3 | 3 | 1 | 1 | 1 | 1 |
| Viscosity (1000 cps, 20° C.) | 584 | 425 | 283 | 231 | 188 | 226 |
| Stable storage period | 350 | Longer than | 240 | 350 | Longer | Longer |

TABLE 5-continued

| Properties | Comparative Example No. 4 | Comparative Example No. 5 | Example No. 15 | Example No. 16 | Example No. 17 | Example No. 18 |
|---|---|---|---|---|---|---|
| (days, at 20° C.) Curing composition | | 360 | | | than 360 | than 360 |
| Viscosity (1000 cps. 20° C.) Gel time (seconds) | 56 | 48 | 35 | 24 | 20 | 23 |
| 120° C. | 111 | 124 | 99 | 104 | 114 | 138 |
| 140° C. | 55 | 63 | 50 | 53 | 56 | 84 |
| Pot life (days, at 20° C.) Cured article | 168 | Longer than than 360 | 217 | 175 | Longer than 360 | Longer than 360 |
| Appearance | Reddish brown Translucent | " | " | " | " | Pale yellow Clear |
| Tg (°C.) Tensile properties | 152 | 150 | 158 | 153 | 151 | 145 |
| Strength (kg/cm$^2$) | 522 | 532 | 570 | 526 | 541 | 508 |
| % Elongation | 2.3 | 3.1 | 5.8 | 3.6 | 2.4 | 8.8 |
| Water absorption (%, after soaking in boiling water for 6 hours) | 0.8 | 0.9 | 0.7 | 0.7 | 0.8 | 0.8 |

What is claimed is:

1. A curing agent for epoxy resin which is fine substantially spherical particles of an amine compound having only one active amino-hydrogen/polyfunctional epoxy compound adduct wherein the size of said particles is in the range or 0.1 μm to 30 μm, said particles being obtained by reacting an amine compound having only one active amino-hydrogen and a polyfunctional epoxy compound at a ratio of the epoxy group in said epoxy compound to the active amino-hydrogen in said amine compound of substantially 1:1 in the presence of a dispersion stabilizer in an organic solvent capable of dissolving both said amine compound and said epoxy compound but incapable of dissolving the adduct formed therefrom at elevated temperatures with agitation, said dispersion stabilizer being a polymeric compound having high affinity to both said organic solvent and said adduct formed.

2. The curing agent of claim 1 having a melting point of at least 50° C.

3. The curing agent of claim 1, wherein said amine compound is 2-methylimidazole.

4. The curing agent of claim 1, wherein said amine compound is N-methylpiperazine.

5. The curing agent of claim 1, wherein said epoxy compound has an epoxy equivalent weight of at most 1,000.

6. The curing agent of claim 5, wherein said epoxy compound has an epoxy equivalent weight of at most 500.

7. The curing agent of claim 6, wherein said epoxy compound is bisphenol A diglycidyl ether.

8. The curing agent of claim 1, wherein said dispersion stabilizer has a molecular weight of 1,000 to 300,000.

9. The curing agent of claim 8, wherein said dispersion stabilizer is a methyl methacrylate/methacrylic acid copolymer graft-copolymerized with methyl methacrylate or a styrene/glycidyl methacrylate copolymer graft-copolymerized with methyl methacrylate.

10. The curing agent of claim 1, wherein said organic solvent has a solubility parameter of 8 to 11.

11. The curing agent of claim 10, wherein said organic solvent is methyl isobutyl ketone or xylene.

12. The curing agent of claim 1, wherein said elevated temperatures are 40° C. to 90° C.

* * * * *